United States Patent
Bachhofer et al.

(10) Patent No.: US 6,455,328 B2
(45) Date of Patent: Sep. 24, 2002

(54) METHOD OF MANUFACTURE OF A CAPACITOR WITH A DIELECTRIC ON THE BASIS OF STRONTIUM-BISMUTH-TANTALUM

(75) Inventors: Harald Bachhofer, Munich (DE); Walter Hartner, Glen Allen, VA (US); Guenther Schindler, Munich (DE); Thomas Peter Haneder, Munich (DE); Wolfgang Hoenlein, Unterhaching (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/781,675

(22) Filed: Feb. 12, 2001

(30) Foreign Application Priority Data

Mar. 1, 2000 (DE) .......................................... 100 09 762

(51) Int. Cl.⁷ .............................................. H01L 21/00
(52) U.S. Cl. .......................................... 438/3; 438/240
(58) Field of Search ............................ 438/3, 239, 240, 438/241, 396, 253

(56) References Cited

FOREIGN PATENT DOCUMENTS

JP          0085941      *   8/1983

OTHER PUBLICATIONS

Yoon et al., "Microcrystalline Oxide–incorporated new diffusion barrier for dynamic random access memory and ferroelectric random access memory capacitor", J. Vac. Sci. Technol. A 15(5), Sep./Oct. 1997.*

* cited by examiner

*Primary Examiner*—Tuan H. Nguyen
(74) *Attorney, Agent, or Firm*—Welsh & Katz, Ltd.

(57) ABSTRACT

The crystallization temperature of a ferroelectric layer (3) (dielectric) for a storage capacitor can be lowered by applying a very thin ($CeO_2$ layer (2)) to a first platinum electrode layer (1) of the storage capacitor before the ferroelectric layer is deposited. The dielectric layer (3) deposited in amorphous state is then crystallized by a temperature treatment step at a temperature in the range between 590° C. and 620° C. A second electrode layer (4) is then applied to complete the storage capacitor.

6 Claims, 1 Drawing Sheet

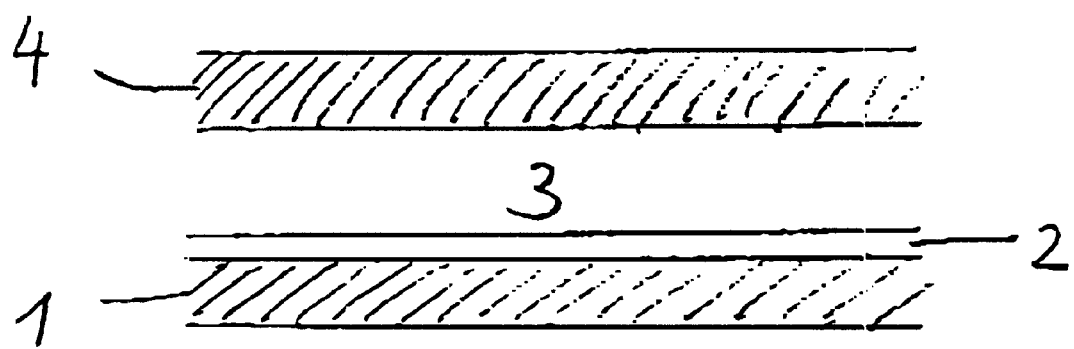
Fig.

METHOD OF MANUFACTURE OF A CAPACITOR WITH A DIELECTRIC ON THE BASIS OF STRONTIUM-BISMUTH-TANTALUM

BACKGROUND OF THE INVENTION

The invention relates to a method for fabricating a storage capacitor, for example a semiconductor component, such as a DRAM or FRAM memory cell.

FIELD OF THE INVENTION

The present invention thus relates to the field of fabricating semiconductor memory components in microelectronics.

DE 198 40 824 C1 discloses a fabric(ation method for a ferroelectric transistor, in which a ferroelectric layer is applied to a $CeO_2$ layer having a thickness of 5–10 nm using a CVD processor and is heat treated at 700° C., in order to transfer is to the desired ferroelectric phase.

DE 198 29 300 A1 discloses a ferroelectric memory device having an electrical connection between a bottom capacitor electrode and a contact plug, and also a corresponding fabrication method.

EF 088 631 782 discloses a dielectric memory apparatus having a ferroelectric dielectric.

U.S. Pat. No. 5,955,755 discloses a semiconductor memory apparatus and a corresponding fabrication method, in which a silicon oxide film, an oriented paraelectric oxide film and an oriented ferrcelectric film are laminated onto a monocrystalline silicon substrate.

The dynamic semiconductor memory components (DRAMs or FRAMS) fabricated in microelectronics essentially comprise a selection or switching transistor and a storage capacitor, in which a dielectric material is inserted between two capacitor plates. The dielectric used is usually oxide or nitride layers in the main, which have a dielectric constant of a maximum of approximately 8. To reduce the size of the storage capacitor and to fabricate nonvolatile memories, "novel" capacitor materials are required, such as ferroelectric or paraelectric materials having significantly higher dielectric constants. A few of these materials are cited in the publication "Neue Dielektrika fur Gbit-Speicherchips" [New Dielectrics for Gbit Memory Chips] by W. Hörlein, Phys. B1. 55 (1999). For fabricating ferroelectric capacitors for applications in such nonvolatile semiconductor memory components with a high integration density, it is possible to use, by way of example, ferroelectric materials, such as $SrBi_2(Ta, Nb)_2C_9$ (SBT or SBTN), $Pb(Zr, Ti)O_3$ (PZT) or $Bi_4Ti_3O_{12}$ (BTO) as the dielectric between the capacitor plates. Alternatively, a paraelectric material, such as $(Basr)TiO_3$ (BST), can be used.

The use of these novel ferroelectric or paraelectric dielectrics presents new challenges to semiconductor process technology, however. Specifically, these novel materials can first no longer be combined with the traditional electrode material polysilicon. It is therefore necessary to use inert electrode materials, such as noble metals, i.e. Pt, Pd, Ir, Rh, Ru or Os, or their conductive oxides (e.g. $RuO_2$). It is also possible to use generally conductive oxides, such as Lasr-CoOx or $SrRuO_3$. The reason for this is that, once the ferroeclric dielectric has been deposited, it needs to be heat treated ("conditioned") in an oxygen-containing atmosphere at temperatures of approximately 550–800° C., if appropriate a number of times. To prevent undesirable chemical reactions between the ferroelectric dielectric and the electrodes, the electrodes are therefore mostly made of platinum or another sufficiently temperature-stable and inert material, such as another noble meatal or a conductive oxide.

Ferroelectric memory components integrate the capacitor module, comprising a first, bottom electrode, the ferroeleclric or paraelectric layer and a second, top electrode, either in the form of a "stacked capacitor" or in the form of an "offset capacitor". In the case of the "stacked capacitor" design, the bottom electrode is connected to the source region or drain region of the associated selection transistor by means of a metalization plug through an insulation layer. By contrast, in the case of the "offset capacitor" design, the top electrode is connected to the drain region of the associated selection transistor by means of the first metalization plane (using a metal tie) and a metalization plug passing through two insulation layers.

The "offset capacitor" design is the technologically simpler design, since the electrical connection is made after fabrication of the capacitor, and hence does not have to withstand the temperature load which arises in the course of this. However, this variant has the associated disadvantage that it takes up a relatively large amount of surface area, since transistor and capacitor need to be arranged next to one another.

In the case of the "stacked capacitor" design, a smaller amount of surface area is required. With this variant, however, the metal plug connecting an electrode of the capacitor to the source or drain has to withstand all the annealing steps which are required for the capacitor without becoming noticeably oxidized in the process. If it becomes so heavily oxidized that there is no longer a conductive connection between the transistor and the capacitor, this causes the cell to fail.

To avoid the problem of oxidation, new barriers are being developed, in the first instance, which resist a high temperature load of 700° C., and moreover in an oxygen atmosphere. In the second instance, attempts are being made to reduce the temperature load required for setting the desired ferroelectric properties, e.g. by purposefully setting a particular stoichiometry for the ferroelectric layer.

In order to crystallize $SrBi_2Ta_2O_9$ (SBT) deposited on platinum in the ferroelectric Aurivillius phase, temperatures of approx. 680° C. are required for SBT layers having a thickness of 180 nm. At this temperature, it is already very difficult to make contact between the capacitor and the transistor such that said contact is not oxidized during heat treatment of the ferroelectric layer in $O_2$, which lasts one hour on average. Opportunities are therefore being sought to lower the process temperature while retaining the same quality for the ferroelectric layer.

SUMMARY OF THE INVENTION

Accordingly, the invention is based on the object of specifying a layer structure having a ferroelectric layer and a method for fabrication thereof and having a ferroelectric layer as a dielectric in which the temperatures used in the fabrication steps, particularly for heat treating or conditioning the ferroelectric layer, can be lowered while retaining the same quality for the the ferroelectric layer.

This object is achieved by the features of the subject matter of claim 1.

The SBT layer or SBTN layer is thus essentially deposited in the form of an amorphous layer, and, after the deposition, a temperature treatment step is carried out in which the amorphous layer crystallizes.

An investigation of the crystallization temperature of $SrBi_2Ta_2O_9$ (SBT) on $CeO_2$ for fabricating ferroelectric transistors revealed that SBT on $CeO_2$ actually starts to develop the ferroelectric Aurivillius phase at approx. 590° C.–620° C. The process temperature for crystallization can thus be lowered by approx. 60° C.–90° C. as compared with SBT deposited directly on platinum.

The method according to the invention can be used to fabricate a storage capacitor, where a first electrode layer is provided as substrate, a very thin $CeO_2$ layer is deposited on the first electrode layer, the SBT layer is then applied to the $CeO_2$ layer and is recrystallized by the temperature treatment step, and finally a second electrode layer is deposited onto the SBT layer.

The electrode layers can be made from a noble metal, in particular platinum, from a conductive oxide of a noble metal or from another conductive and inert oxide.

The present invention is explained in more detail below with the aid of an illustrative embodiment shown in the drawing.

DETAILED DESCRIPTION OF ONE EMBODIMENT OF THE INVENTION

The drawing shows a storage capacitor which, by way of example, can be fabricated as part of a semiconductor memory component (not shown). In this memory component, the storage capacitor is isolated from the selection transistor by an insulation layer and is arranged either directly above ("stacked cell") or offset above ("offset cell") the selection transistor. A first electrode layer 1 of the storage capacitor, which layer may be made of platinum, for example, is applied to the insulation layer.

CVD, for example, is then used to deposit a very thin $CeO_2$ layer 2 having a thickness of, by way of example, 1 nm. As the $CeO_2$ layer 2 is very thin, it has no substantial influence on the electrical response of the capacitor which is to be fabricated, bearing in mind the much thicker SBT layer. On the other hand, this layer can greatly assist in significantly lowering the crystallization temperature of SBT.

A sputter method, for example, is then used to deposit an $SrBi_2Ta_2O_9$ (SBT) or $SrBi_2(Ta, Nb)_2O_9$ (SBTN) layer 3 having a thickness of 20–200 nm, for example, onto the $CeO_2$ layer 2. This (deposited) layer is intended to be used as the dielectric in the storage capacitor. After deposition, the layer 3 is present in amorphous state and first needs to be crystallized. Hence, after the deposition, a temperature treatment step is carried out at a temperature preferably in the range between 590° C. and 620° C. and for a time lasting between a few minutes and a number of hours, in order to crystallize the layer (which is amorphous when deposited) at least partially, i.e. to convert it into a polycrystalline layer.

A second electrode layer 4 is then applied to the crystallized dielectric layer 3 in order to complete the storage capacitor.

The invention makes it possible to simplify, in particular, the fabrication of a storage capacitor based on the "stacked cell" design, since a metalization plug connecting the first electrode layer 1 to the drain of the selection transistor is now exposed only to a maximum temperature in the range between 590° C. and 620° C. On the other hand, lowering the process temperature for crystallizing the ferroelectric layer sometimes also benefits other already existing component sections.

What is claimed is:

1. A method for fabricating a storage capacitor whose dielectric is made up of a ferroelectric layer based on strontium-bismuth-tantalum, having the following steps:
   providing a first electrode layer;
   applying a CeO2 layer to the first electrode layer which has a thickness of <5 nm;
   applying an essentially amorphous dielectric layer comprises $SrBi_2Ta_2O_9$ (SBT) or $SrBi_2 (TaNb)_2O_9$) (SBTN) to the $CeO_2$ layer:
   carrying out a temperature treatment step for crystallizing the dielectric layer in the range between 590° C. and 620° C. and
   applying a second electrode layer to the dielectric layer.

2. The method as claimed in claim 1, further including the step of fabricating the electrode layers from a noble metal, from a conductive oxide of a noble metal, from a conductive oxide of a noble metal or from another inert and conductive oxide.

3. The method of claim 2 wherein the noble metal is platinum.

4. The method as claimed in any of claims 1 to 3, wherein the dielectric layer has a thickness of 20–200 nm.

5. The method of claim 1 wherein the first electrode layer has a thichness of about 1 nm.

6. A method for fabricating a semiconductor component in which including the steps of
   forming a switching transistor on a semiconductor substrate, and
   forming a storage capacitor on the switching transistor by providing a first electrode layer;
   applying a CeO2 layer to the first electrode layer which has a thickness of <5 nm;
   applying an essentially amorphous dielectric layer comprises $SrBi_2Ta_2O_9$ (SBT) or $SrBi_2 (TaNb)_2O_9$) (SBTN) to the $CeO_2$ layer:
   carrying out a temperature treatment step for crystallizing the dielectric layer in the range between 590° C. and 620° C. and
   applying a second electrode layer to the dielectric layer.

* * * * *